United States Patent
Berger et al.

(10) Patent No.: US 6,838,668 B2
(45) Date of Patent: *Jan. 4, 2005

(54) SYSTEM FOR IMAGING A CROSS-SECTION OF A SUBSTRATE

(75) Inventors: Steve Berger, Portland, OR (US); Lawrence Scipioni, Danvers, MA (US)

(73) Assignee: FEI Company, Hillsboro, OR (US)

( * ) Notice: Subject to any disclaimer, the term of this patent is extended or adjusted under 35 U.S.C. 154(b) by 63 days.

This patent is subject to a terminal disclaimer.

(21) Appl. No.: 10/679,100

(22) Filed: Oct. 3, 2003

(65) Prior Publication Data

US 2004/0065826 A1 Apr. 8, 2004

Related U.S. Application Data

(63) Continuation of application No. 09/513,826, filed on Feb. 25, 2000, now Pat. No. 6,727,500.

(51) Int. Cl.[7] .................... G21K 7/00; G02N 23/00
(52) U.S. Cl. ................ 250/306; 250/310; 250/423 F; 250/442.11
(58) Field of Search ....................... 250/423 F, 442.11

(56) References Cited

U.S. PATENT DOCUMENTS

| | | |
|---|---|---|
| 4,609,809 A | 9/1986 | Yamaguchi et al. |
| 4,634,871 A | 1/1987 | Knauer |
| 4,661,709 A | 4/1987 | Walker et al. |
| 4,694,178 A | 9/1987 | Harte |
| 4,820,898 A | 4/1989 | Slingerland |
| 4,874,460 A | 10/1989 | Nakagawa et al. |
| 4,876,112 A | 10/1989 | Kaito et al. |
| 4,894,549 A | 1/1990 | Stengl |
| 5,051,556 A | 9/1991 | Sakamoto et al. |
| 5,093,572 A | 3/1992 | Hosono |
| 5,149,974 A | 9/1992 | Kirch et al. |

(List continued on next page.)

FOREIGN PATENT DOCUMENTS

| | | |
|---|---|---|
| DE | 3910054 A1 | 10/1990 |
| EP | 0257684 B1 | 1/1991 |
| JP | 6169125 | 4/1986 |
| WO | WO0075954 | 12/2000 |

OTHER PUBLICATIONS

Slingerland, H.N., Barth, J.E., Koets, E. Kramer, J. van der Mast, K.D., "Propasal for a Second Generation IBPG," Proceedings Microcircuit Engineering Conference, 1984, Microcircuit Engineering, 1985, pp. 381–387.

Slingerland, H.N., Bohlander, J.H., van der Mast, K.D., Koets, E., "Progress on the Delft Ion Beam Pattern Generator," Microelectronic Engineering 5 (1986), Elsevier Science Publishers B.V (North Holland), pp 155–161.

Tuggle, D.W., Swanson. L.W., and Gesley, M.A., "Current Density Distribution in a Chromatically Limited Electron Microprobe," J. Vac. Sci. Technol. B4 (1) Jan/Feb 1986 pp. 131–134.

(List continued on next page.)

Primary Examiner—John R. Lee
Assistant Examiner—James J. Leybourne
(74) Attorney, Agent, or Firm—Michael O. Scheinberg

(57) ABSTRACT

A system for obtaining an image of a cross-sectional surface of a workpiece includes a shaped beam ion projection column oriented along a first axis. The ion projection column projects an image of an aperture on the workpiece surface, thereby excavating a portion of the surface and exposing a cross-sectional surface. Because the ion beam is not focused on the surface, a low brightness ion source can be used. A focused particle beam column, typically a scanning electron microscope, is oriented along a second axis that intersects the first axis at a selected angle. This focused particle beam column generates a particle beam that is used to image the cross-sectional surface exposed by the ion projection column.

22 Claims, 6 Drawing Sheets

U.S. PATENT DOCUMENTS

| | | | |
|---|---|---|---|
| 5,188,705 | A | 2/1993 | Swanson et al. |
| 5,270,552 | A | 12/1993 | Ohnishi et al. |
| 5,376,791 | A | 12/1994 | Swanson et al. |
| 5,435,850 | A | 7/1995 | Rasmussen |
| 5,574,280 | A | 11/1996 | Fujii et al. |
| 5,587,568 | A * | 12/1996 | Lothamer et al. ......... 200/16 R |
| 5,827,786 | A | 10/1998 | Puretz |
| 5,945,677 | A | 8/1999 | Leung et al. |
| 6,011,269 | A | 1/2000 | Veneklasen et al. |
| 2003/0143453 | A1 * | 7/2003 | Ren et al. ..................... 429/40 |

OTHER PUBLICATIONS van der Mast, K.D., Jansen. G.H., Barth, J.E., "The SHower–Beam Concept," Microelectronic Engineering 3 (1985), Elsevier Science Publishers B.V. (North Holland), pp. 43–51.

van der Mast, K.D.. Pijper., and Barth, J.E.. "A Flexible Beamshaper." MicroelectronicEngineering 5 (1986), Elsevier Science Publishers B.V. (North Holland), pp. 115–122.

Vijgen. L., "Coulomb Interactions In Focused Ion Beam Columns," 3 Beams Conference 1992.

R.S. Longhurst, Geometrical and Physical Optics, 3rd Edition (Longman, London) pp. 333.

P. Hawkes and E. Kasper, Principles of Electron Optics, vol. 2 (Academic Press, London) Chapter 43.

L. Vijgen and P. Kruit, Coloumb Interactions in a Shaped Ion Beam Pattern Generator. J. Vac. Sci Tech. B 10 (6), 2809 (1992).

K. Edinger, V. Yun, J. Meingailie, and J. Orloff. Development of a High Brightness Gas Field Ion SOurce. J. Vac. Sci. Tech. B 15(6), 2365(1997).

Bauer, E., Koziol, C., Lilienkamp, G., Schmidt, T., "Spectromicroscopy in a Low Energy Electron Microscope," Journal of Electron Spectroscopy and Related Phenomena 84 (1997) pp 201–209.

Edinger, Klaus and Krans, Thomas, "Modeling of Focused IOn Beam Induced Surface Chemistry," Journal of Vacuum Science Technology B 18(6), Nov/Dec 2000; pp. 3190–3193.

Hawkes, P.W. and Kasper, E., Principles of Electron Optics, vol. 2., Applied Geometrical Optics, Academic Press, 1989: Chapters 47, 48 pp 971–1003.

Orloff, J., Li, J.Z., Sato, M., "Experimental Study of a Focused Ion Beam Probe Size and Comparison with Theory," Journal of Vacuum Science Technology, B9 (5), Sep/Oct 1991, pp 2609–2612.

Orloff, J., and Sudraund, Pierre, "Design of a 100 kV, High Resolution Focused Ion Beam Column with a Liquid Metal Ion Source," Microelectronic Engineering 3 (1985) pp. 161–165.

Orloff, J., and Swanson, L.W., "Some Considerations on the Design of a Field mission Gun for a Shaped Spit Lithography System," Optik, vol. 61, No. 3 (1982), pp 237–245.

"Plasmalon SOurce–ECR microwave plasma ion sournce," http://www.tectra.de/plasma–ion–source.htm, Feb 18, 2000 Contact: Dr. Christian Bradley, tectra GmbH, Reuterweg 65, D–60323 Frankfurt/M.

Sato, M., and Orloff, J., "A Method for calculating the Current Density of Charged Particle Beams and the Effect of Finite SOurce Size and Spherical and Chromatic Aberrations on the Focusing Characteristics," Journal of Vacuum Science Technology, B, vol 9, No. 5, Sep/Oct 1991; pp.

Stickel, W., "Simulation of Columb Interactions in Electron Beam Lithography Systems—A Compatison of Theoretical Models," Papers from the 42nd International COnference on Electron, Ion. and Photon Beam Technology and Nanofabrication, May 26–29, 1998.

Singerland, H.N., "Optimization of aChromatically Limited Ion Microprobe," Microelectronic Engineering2 (1984) 219–226.

S. Guharay, W. Wang, V. Didnikov, M. Reiser, J. Orloff, and J. Meingailisn High–Brightness Ion Source for Ion Projection Lithography, J. Vac. Sci. Tech. B. 14(6), 3907 (1996).

Y. Lee, R. Gough, W. Kunkel, K. Leung, L. Perkins, D. Pickard, L. Sun, J. Vujic, and M. Williams. Development of Ion Sources for Ion Projection Lithography, J. Vac. Sci. Tech. B 14(6), 3947 (1996).

* cited by examiner

SYSTEM FOR IMAGING A CROSS-SECTION OF A SUBSTRATE

This application is a continuation of U.S. patent application Ser. No. 09/513,826, filed on Feb. 25, 2000, now U.S. Pat. No. 6,727,500, which is hereby incorporated by reference.

This invention relates to particle beams, and in particular, to systems and methods for imaging a cross-section of a semiconductor substrate using a particle beam.

BACKGROUND

Integrated circuits frequently incorporate devices that extend deeply into a semiconductor substrate or wafer. In the manufacture of such integrated circuits, it is desirable to periodically inspect the structure of these devices. In most cases, this is achieved by inspecting a cross-section of the wafer on which the integrated circuits are formed.

The conventional method for inspecting a cross-section of a semiconductor substrate generally includes the removal of material from the substrate in order to expose a cross-sectional surface. This is followed by the illumination of that surface by an imaging beam. The step of exposing a cross-sectional surface is typically accomplished by scanning the front surface of the semiconductor substrate with a focused ion-beam to excavate a trench. The vertical wall of this trench forms the cross-sectional surface to be imaged by the imaging beam.

The imaging beam is typically a particle beam that scans the cross-sectional surface exposed by the scanning focused ion-beam. The interaction of this particle beam with the cross-sectional surface results in the emission of charged particles. These charged particles are detected by a detector that provides data to a processor for transformation of the data into a cross-sectional image of the semiconductor substrate.

A disadvantage of the foregoing method of obtaining a cross-sectional image is that the cross-sectional surface is exposed point by point using a focused ion-beam. Because the ion-beam is focused to a small point, the source of ions must be one that is capable of providing a large ion current in a small area. Such sources, which are referred to as "bright" sources, typically use, as a source of ions, a metal that is liquid at or slightly above room temperature. For brevity, we refer to such metals as "liquid metals." Of these liquid metals, the one generally considered most practical, because of its high boiling point, is gallium.

Unfortunately, it is extremely undesirable to introduce stray metal ions, such as gallium, into the semiconductor fabrication process. The presence of even small amounts of metal ion left on a semiconductor substrate following exposure to a focused ion beam can, through diffusion, contaminate other circuits formed on that substrate. As a result, following inspection of the cross-section of a wafer, the entire wafer is routinely discarded.

It is therefore desirable in the art to provide a method and system for imaging a cross-section of a substrate but without the deposition of stray metal ions on the substrate.

SUMMARY

A system according to the invention excavates a trench on the substrate by projecting an image of an aperture onto the substrate instead of by scanning a focused ion beam across the substrate. This relieves the constraint that the ion source be a bright source and opens the door to the use of an ion source other than a liquid metal source.

More particularly, in a system embodying the invention, the cross-sectional surface to be imaged is exposed by projecting an ion beam image of an aperture onto the front surface of a workpiece. This workpiece is typically a semiconductor substrate, or wafer. Because the ion beam source is not focused directly on the front surface of the workpiece, the constraints on the brightness of the ion source are considerably relaxed. In particular, in a system incorporating the principles of the invention, one can generate an ion beam with an ion source other than a liquid metal source. Because of the reduced risk of contamination by stray metal ions, the system of the invention is thus particularly suited for cross-sectional imaging of semiconductor wafers.

A system according to the invention includes a shaped-beam ion-projection column extending along a first axis. The ion-projection column illuminates the workpiece with an image of an aperture and thereby excavates a section of the workpiece having the size and shape of the aperture as projected by the ion-projection column, including any magnification factor. A vertical wall of the excavated section of the workpiece forms a cross-sectional surface that is then illuminated by a focused particle-beam generated by a focused-particle-beam column. The focused-particle beam column is oriented along a second axis that intersects the first axis at a predetermined angle. This predetermined angle can be either fixed or adjustable by a system operator.

The focused-particle-beam column can be either a scanning electron-microscope, in which case the focused particle-beam is a beam of electrons, or a scanning focused ion beam column, in which case the focused particle-beam is an ion beam.

The ion source in the shaped-beam ion-projection column can be a relatively low brightness source. Such low brightness sources are typically characterized by a brightness of less than 100,000 amps per square centimeter per steradian. These low brightness sources can be plasma sources, or surface plasma sources. However, the ion source can also be a liquid metal source such as a gallium source.

The shaped-beam ion-projection column can include a mask having an aperture in the shape of the region to be excavated. The mask is typically disposed between the ion source and the wafer surface. While the aperture can be any shape, it is preferable that the aperture have at least one straight edge for forming an easily imaged cross-sectional surface.

In practice, the edges of the aperture cannot be made perfectly smooth. In order to reduce the effect of imperfections in the edge of the aperture, the apparatus of the invention further includes an optional dithering system. Such a dithering system includes deflector plates disposed between the mask and the surface of the wafer. A time-varying voltage on these deflector plates causes a time-varying electric field through which the ions forming the image of the aperture pass on their way to the wafer surface. The periodic translation of the ion beam in response to the time varying electric field through which it passes results in a periodic variation in the location of the projected image on the front surface of the workpiece. This periodic variation in the location of the projected image averages out effects of imperfections on the edge of the aperture.

In another embodiment, a workpiece support holds a workpiece at a selectable angle relative to an ion beam generated by an ion-beam column. In this embodiment, the system switches between a cutting mode and an imaging mode. In the cutting mode, the workpiece support holds the workpiece such that its front surface is normal to the ion beam. The ion-beam column then focuses an image of an aperture on the front surface to excavate a section of the workpiece having the projected size and shape of the aperture. A vertical wall of the excavated section of the workpiece forms a cross-sectional surface. In the imaging mode, the workpiece support holds the workpiece at an angle relative to the ion-beam. In this mode, the ion-beam column scans a focused ion-beam along the cross-sectional surface and thereby forms an image of that surface.

BRIEF DESCRIPTION OF THE DRAWINGS

The foregoing and other objects, features and advantages of the invention will be apparent from the following description and the accompanying drawings, in which.

DETAILED DESCRIPTION

Figure 1:
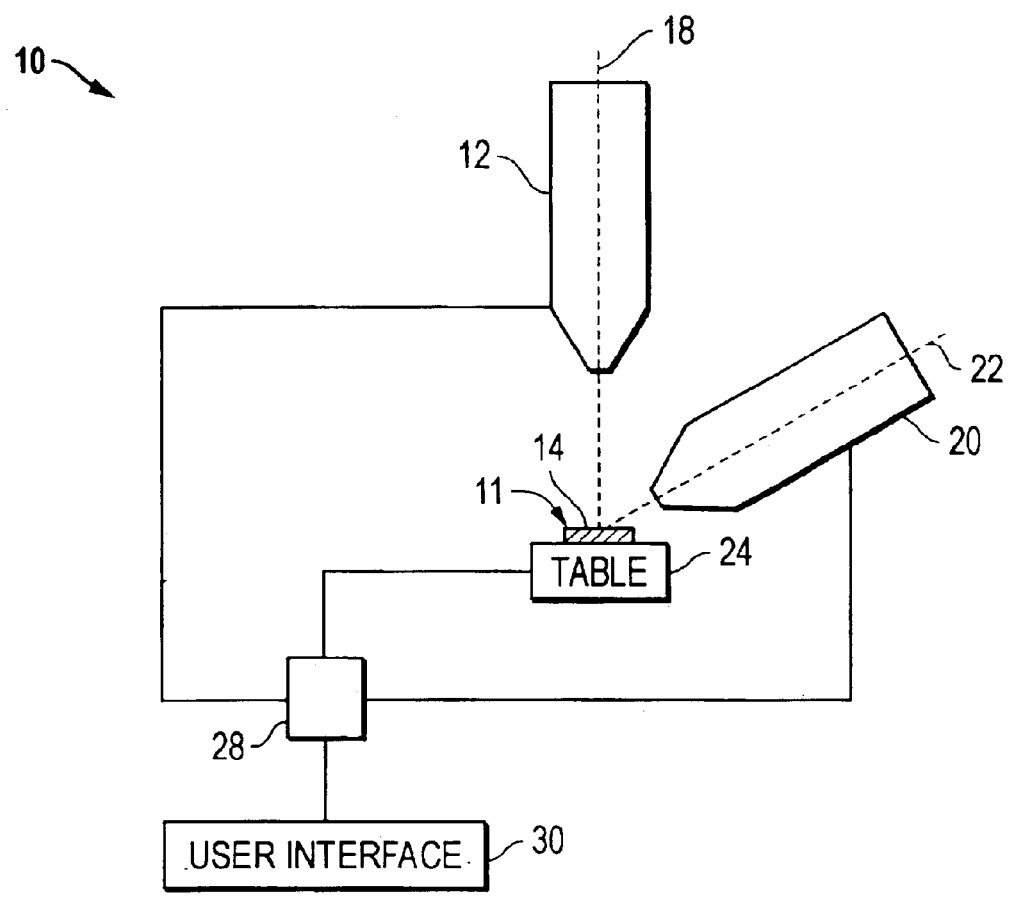
FIG. 1 is a schematic illustration of a first embodiment of a cross-sectional imaging system incorporating the invention.

A particle-beam system 10 for obtaining an image of a cross-section of a workpiece 11, as shown in FIG. 1, includes a shaped-beam ion-projection column 12 configured to project an image of an aperture onto the front surface 14 of the workpiece 11. Preferably, the projection column 12 is oriented along a first axis 18 normal to the front surface 14 of the workpiece 11 such that the ion beam is at normal incidence to that front surface 14.

The system 10 further includes a focused-particle-beam imaging column 20 oriented along a second axis 22 that is canted relative to the first axis 18 so that it intersects the first axis 18 at a selected angle. The selected angle is other than ninety degrees and is preferably selected to be between thirty and sixty degrees. However, the invention includes the use of other non-right angles.

The workpiece 11 is mounted on a table 24 that is capable of translation in response to instructions provided by a processor 28. The processor 28, which also provides instructions to the projection column 12 and to the imaging column 20, is under the control of an operator who communicates with the processor 28 by means of a user-interface 30. The user-interface 30 is a keyboard and/or a touch-responsive display screen.

Figure 2:
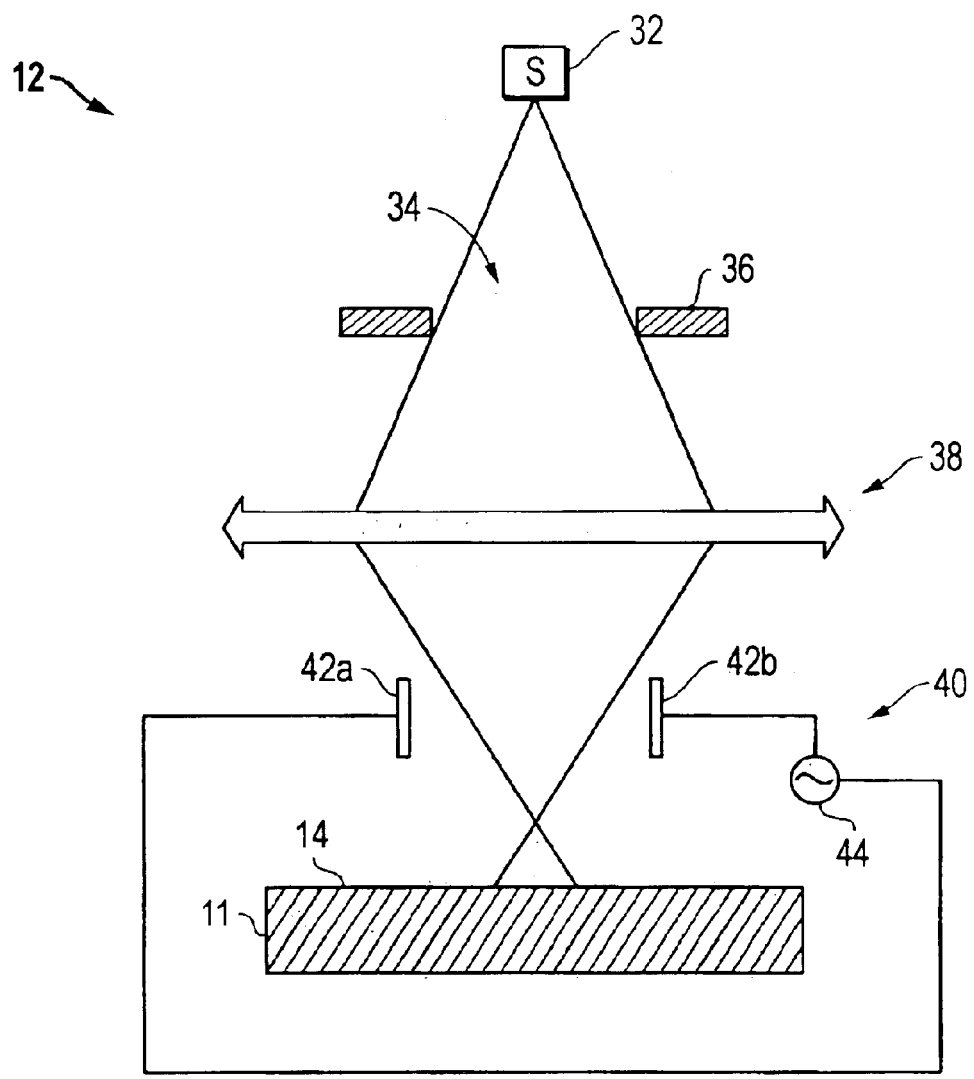
FIG. 2 shows the ion beam column of FIG. 1 projecting an image of an aperture onto a workpiece.

The projection column 12, shown in more detail in FIG. 2, includes an ion source 32 that emits an ion beam colinear with the first axis 18 and in the direction of the workpiece 11. On its way to the workpiece 11, the ion beam passes through an aperture 34 in a mask 36. The shape of this aperture 34 defines the shape of that region of the workpiece 11 that is to be excavated by the ion beam. The ion beam than passes through a lens system 38 that focuses an image of the aperture onto the front surface 14 workpiece 11. In a preferred embodiment, the number and arrangement of the lenses in the lens system 38 is chosen to control the illumination and magnification of this aperture image.

The acuity of the walls of the excavated section of the workpiece 11 depends on the extent of the image blur caused by the lens system 38. If the lens system 38 places the aperture image at optimal focus, the edge of the excavated section will be sharply defined. Otherwise, the edge will be blurred by an amount approximated by the product of the angular size of the source, as projected into the workpiece, and the extent to which the workpiece is displaced from the plane of optimal focus. The maximum allowable displacement is commonly referred to as the system's depth-of-focus.

The shape of the aperture 34 formed in the mask 36 can be rectangular, triangular, circular, or any other aperture configuration. However, it is preferable that the aperture 34 include at least one straight edge so that the resulting excavated region of the workpiece 11 has a suitably long vertical wall forming the cross-sectional surface to be imaged by the imaging column 20.

Although the ion source 32 can be a liquid metal source, the brightness of such a source is no longer needed in order to excavate a region of the workpiece 11. Assuming a constant ion current, the ratio of (i) the brightness required of a focused ion beam system to (ii) the brightness required of a projection beam system depends on the ratio of the area illuminated by the focused ion beam to the area of the projected aperture in the projection beam system. For a typical focused ion beam illuminating a circle with a one-hundred nanometer diameter and a typical projected aperture having linear dimensions of ten microns, the brightness requirement of the ion source is reduced by a factor of ten thousand.

Because the ion source in a projection system need not have such high brightness, a broader selection of ion sources is available for a system incorporating a projection column. In one preferred embodiment, the ion source 32 is one that does not emit trace metal ions. Such preferred sources include plasma sources, field emission gas ion sources, or surface plasma sources. Low brightness sources are typically characterized by a brightness of less than 1000 amps per square centimeter per steradian.

The selection of ion sources for the projection column 12 is constrained by the requirement that the emittance of the ion source 32 be sufficiently high to provide an ion flux suitable for excavating a region of the substrate. Emittance is the product of the ion beam's projected area and its beam convergence angle in an optical plane. The emittance required of an ion source in a projection system is typically many orders of magnitude higher than the emittance required of a probe system. An extended discussion of the concepts of emittance and brightness is found in *Principles of Electron Optics* by P. Hawkes and E. Kasper, which is hereby incorporated by reference.

In practice, the requirement of high emittance is met by providing an extended source of ions rather than a point source. Examples of extended sources suitable for practice of the invention are given in *Development of Ion Sources for Ion Projection Lithography*, Y. Lee at al., Journal of Vacuum Science and Technology, B 14(6), 3947 (1996).

Because of imperfections in the formation of an aperture 34, the edges of the aperture 34 are not perfectly smooth. In order to mitigate the effect of any roughness in the edges of the aperture 34, the projection column 12 optionally includes a dithering system 40 to correct for the effect of roughness on the edges of the aperture 34.

Figure 3:
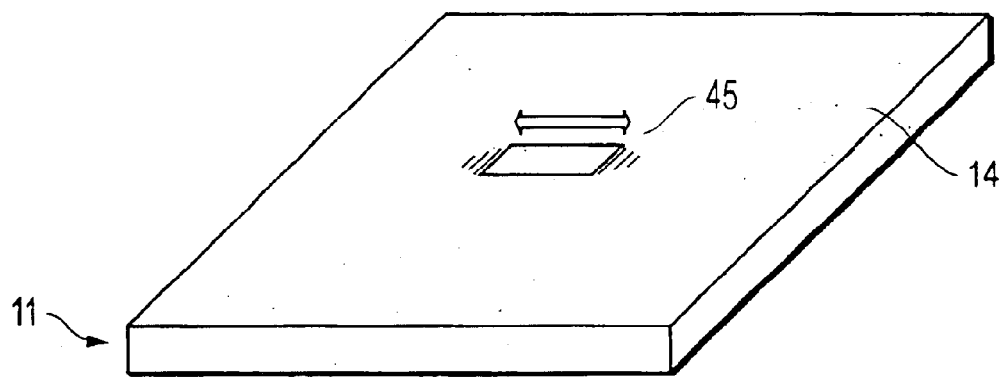
FIG. 3 shows an aperture on the workpiece as projected by the ion beam column shown in FIG. 2.

The illustrated dithering system includes deflecting plates 42a,b disposed between the lens system 38 and the workpiece 11. These deflecting plates 42a,b are connected to a signal source 44 that provides a time-varying electric field between the deflecting plates. Because the ions are charged particles, the time-varying electric field results in time-varying motion of a projected image 45 on the workpiece 11, as shown in FIG. 3. By suitably selecting the amplitude and frequency of the signal generated by the signal source 44, one can smooth out, or average out, the effects of imperfections in the edge of the aperture 34, thereby simulating an aperture having perfectly smooth edges.

Preferably, the signal applied to the deflecting plates 42a,b has an amplitude selected such that the amplitude of the dithering motion is greater than the roughness of the aperture edges. The signal frequency is selected so that the resulting excavation on the workpiece surface has substantially vertical walls. The preferred waveform generated by the signal generator 44 is a triangular wave having an amplitude and frequency consistent with the foregoing requirements.

Figure 4:
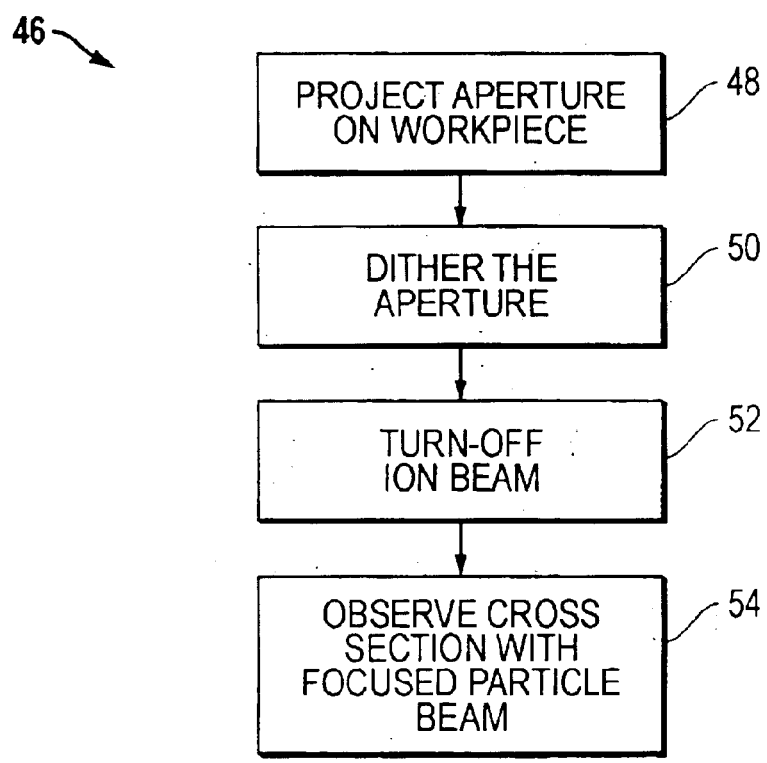
FIG. 4 is a flow chart illustrating steps followed by the system of FIG. 1 in imaging a cross-section of the workpiece shown in FIG. 3.

FIG. 4 summarizes the method 46 of imaging a cross-sectional surface of a workpiece in accordance with the invention. The method includes the step of projecting an image of the aperture onto the workpiece (step 48). This results in excavation of a region on the workpiece surface. The excavated region has a vertical wall that forms the cross-sectional surface that is later imaged by the imaging column. Optionally, a dithering subsystem smoothes the effect of any rough edges of the aperture by dithering the position of the projected aperture on the workpiece (step 50).

After a suitable period of exposure, the ion beam is turned off (step 52). The exposure period depends on the characteristics of the ion source, the properties of the substrate, and the desired depth of the excavated region. Suitable exposure periods are determined either by calculation, using known methods, or empirically.

The cross-sectional surface exposed by the projection column is then scanned by the focused particle-beam provided by the imaging column (step 54). Although the focused particle-beam can be an ion-beam, the resolution of an ion-beam is significantly lower than that of an electron beam. Since the imaging column is not used for excavation of the workpiece, there is no advantage to the use of an ion beam. Hence, in the preferred embodiment, the focused particle beam for imaging the workpiece is an electron beam provided by a scanning electron microscope.

Figure 5:
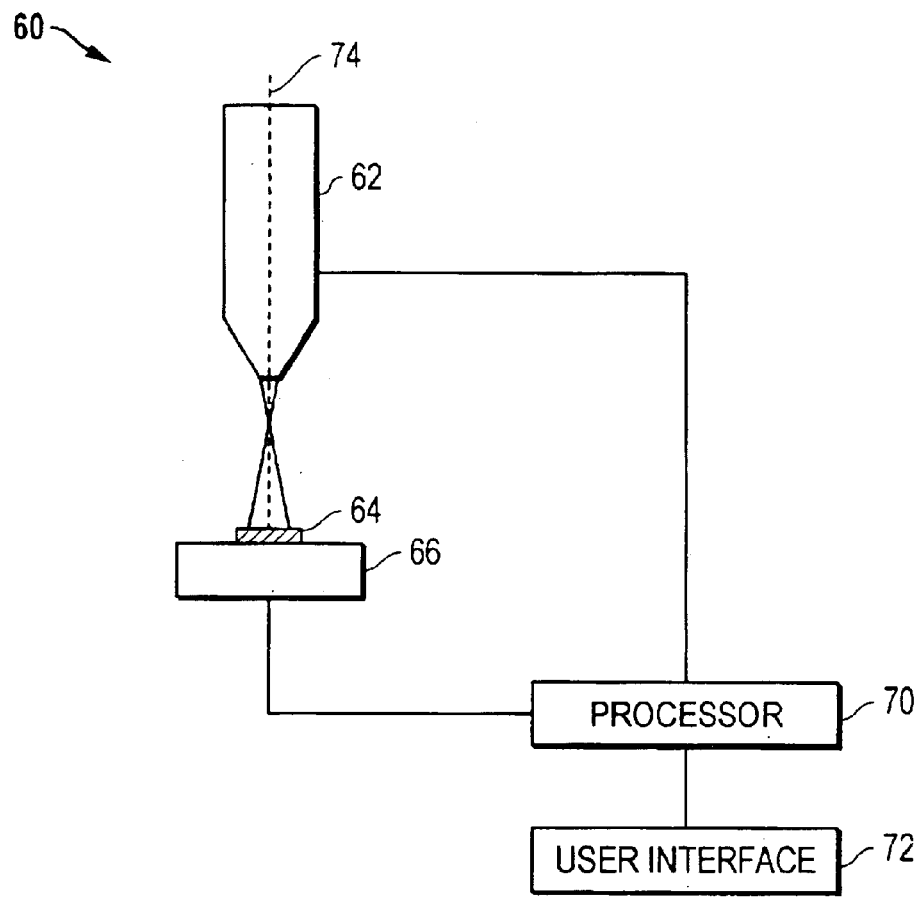
FIG. 5 shows a second embodiment of a cross-sectional imaging system operating in a cutting mode in which the workpiece surface is normal to an ion beam.

In a second embodiment of the invention, shown in FIG. 5, an ion beam column is switchable between a projection mode, for excavating the workpiece surface, and an imaging mode, for imaging the cross-section of the workpiece. In the projection mode, the ion beam column 62 projects an image of an aperture onto a workpiece 64, thereby excavating a portion of its front surface and exposing a cross-sectional surface for imaging. The details associated with the excavation of the workpiece surface are identical to those already described in the connection with the projection column 12 of the first embodiment 10, and need not be repeated here.

In the second embodiment 60, a workpiece 64 is mounted on a tilting table 66 A processor 70 in communication with both the table 66 and the ion beam column 62 controls those elements in response to instructions provided by an operator by means of a user-interface 72 coupled to the processor 70.

In operation, the ion beam column 62 is operated first in a projection mode, shown in FIG. 5, in which the tilting table 66 holds the workpiece 64 such that the surface of the workpiece is normal to a column axis 74 of the ion beam column 62. During this projection mode, the ion beam column 62 projects an image of an aperture on the workpiece 64 in a manner identical to that described above in connection with the ion beam column 12 shown in FIGS. 1 and 2. This results in the exposure of a cross-sectional surface of the workpiece.

Figure 6:
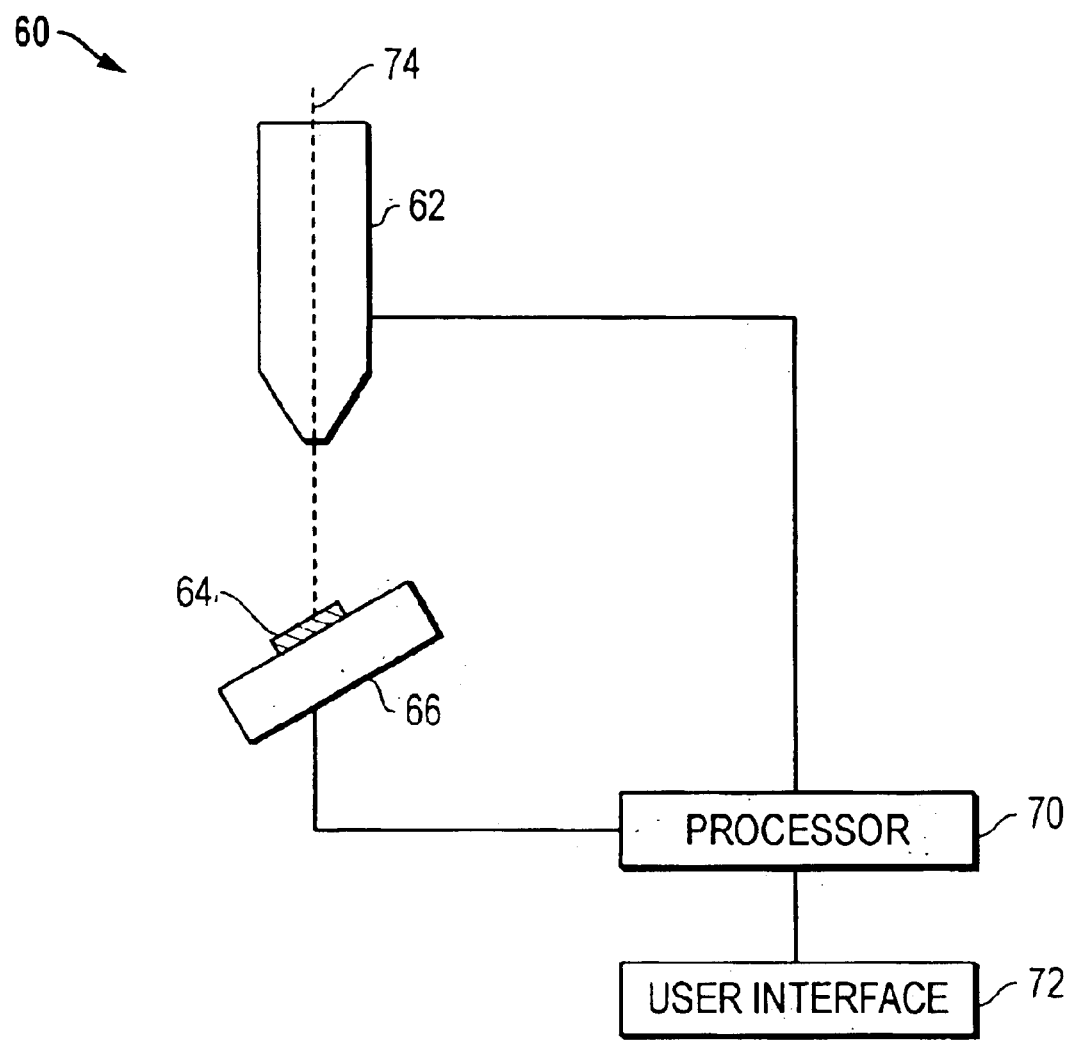
FIG. 6 shows the system of FIG. 5 operated in an imaging mode in which the workpiece surface is tilted relative to the ion beam.

Following the formation of a cross-sectional surface, the ion beam column 62 is operated in an imaging mode, as shown in FIG. 6. During imaging mode, the tilting table 66 holds the surface of the workpiece 64 at an angle relative to the column axis 74 of the ion beam column 62. This tilt exposes the cross-sectional surface to a focused ion beam generated by the ion beam column 62. Thus, in this second embodiment, the ion beam column 62 switches between projecting an image of an aperture on the workpiece 64, and scanning a focused ion beam on the workpiece. The former mode of operation is well suited for excavating a region of the workpiece but cannot readily be used to form an image. The latter mode of operation is well suited for imaging but somewhat inefficient for excavation.

Figure 7:
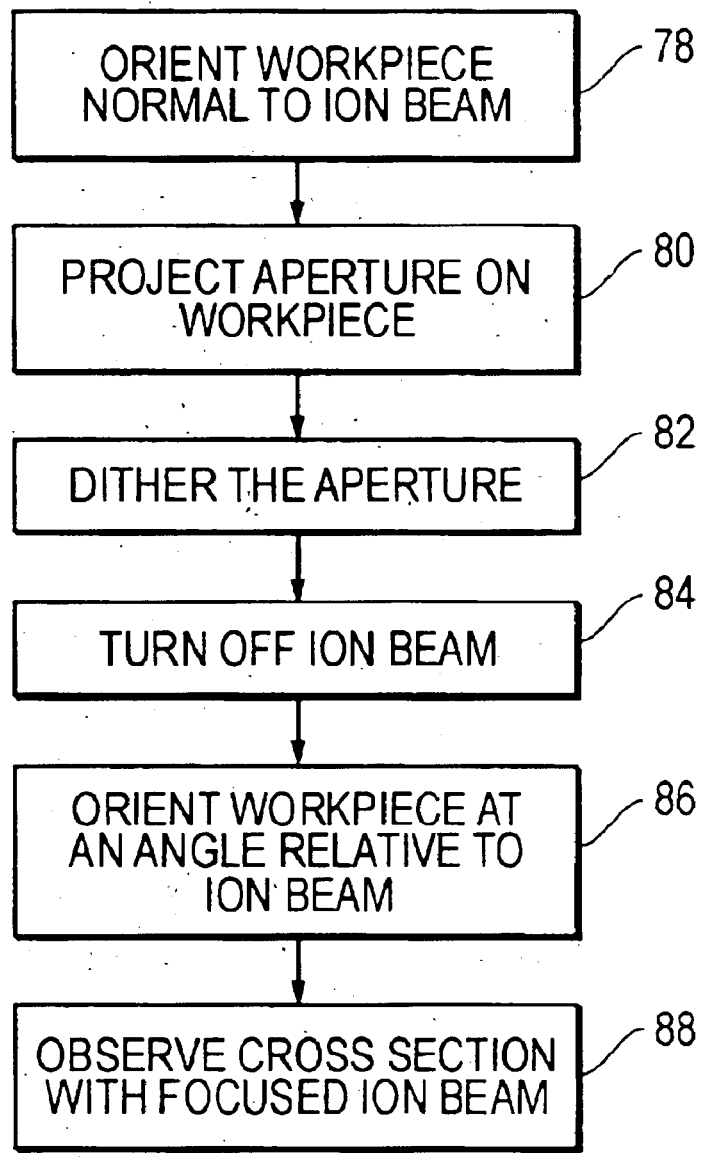
FIG. 7 is a flow chart illustrating steps followed by the system of FIGS. 5 and 6 in imaging a cross-section of a workpiece.

FIG. 7 summarizes the steps in a method 76 for imaging a cross-sectional surface of the workpiece using the system shown in FIGS. 5 and 6. The workpiece is first oriented so that its front surface is normal to the ion beam (step 78). An image of the aperture is then projected onto the workpiece (step 80). This results in excavation of a region on the workpiece surface. The excavated region has a vertical wall which forms the cross-sectional surface that is later imaged by the imaging column. To the extent that the edges of the aperture are not perfectly smooth, a dithering subsystem dithers the position of the projected aperture on the workpiece (step 82), thereby averaging out the affect of any irregularities in the edges of the aperture.

After a suitable exposure period, the ion beam is turned off (step 84). The exposure period depends on the characteristics of the ion source, the properties of the substrate, and the desired depth of the excavated region. Suitable exposure periods are determined either by calculation, using known methods, or empirically.

Once the cross-sectional surface has been exposed by the projection column, the workpiece is re-oriented so that its front surface intersects the ion beam at an angle (step 86). The ion beam is now focused onto the cross-sectional surface and scanned along that surface to form the desired cross-sectional image (step 88).

It will thus be seen that the invention efficiently attains the objects set forth above. Since certain changes may be made in the above constructions without departing from the scope of the invention, it is intended that all matter contained in the above description or shown in the accompanying drawings be interpreted as illustrative and not in a limiting sense.

It is also to be understood that the following claims are intended to cover all generic and specific features of the invention described herein, and all statements of the scope of the invention which as a matter of language might be said to fall there between. Having described the invention, what is claimed as new and secured by Letters Patent is:

What is claimed is:

1. An apparatus for imaging a cross-section of a workpiece, said apparatus comprising a low brightness shaped-beam ion column for producing an ion beam, the column including an aperture positioned in the beam path to pass less than all the ions in the beam, the ion column oriented along a first axis and illuminating said workpiece to form a cross-section thereon, and a focused-particle-beam column oriented along a second axis that intersects said first axis at a predetermined angle, said focused-particle-beam column generating a focused particle beam illuminating said cross-section.

2. The apparatus of claim 1 wherein said focused-particle-beam-column comprises a scanning electron microscope.

3. The apparatus of claim 1 wherein said focused-particle-beam column comprises a focused ion beam column.

4. The apparatus of claim 1 wherein said ion column includes an ion source having a brightness less than 100,000 amps per square centimeter per steradian.

5. The apparatus of claim 4 wherein said ion source has a brightness less than 10,000 amps per square centimeter per steradian.

6. The apparatus of claim 1 wherein said ion column includes an ion source selected from a group consisting of a plasma source, a field emission gas ion source, a surface plasma source, and a liquid metal source.

7. The apparatus of claim 1 wherein said shaped-beam ion column comprises an ion source generating an ion beam, and an ion-blocking mask having an aperture formed therethrough, said mask disposed between said ion source and said workpiece.

8. The apparatus of claim 7 wherein said shaped-beam ion column further comprises a deflection plate disposed between said ion-blocking mask and said workpiece, and a voltage source connected to said deflection plate for placing an electric charge thereon.

9. The apparatus of claim 8 wherein said voltage source comprises a signal generator for placing a time-varying charge on said deflection plate.

10. The apparatus of claim 7 wherein said ion-blocking mask includes at least one straight edge producing a beam that etches at least one substantially straight edge on the work piece.

11. The apparatus of claim 1 wherein said pre-determined angle is between approximately thirty degrees and sixty degrees.

12. The apparatus of claim 1 in which the shaped-beam ion column includes a non-liquid metal ion source.

13. The apparatus of claim 1 in which the shaped-beam ion column includes a liquid metal ion source.

14. An apparatus for imaging a cross-section of a workpiece having a front surface, said apparatus comprising an shaped-beam ion-beam column switchable between a cutting mode in which a shaped beam limited by an aperture illuminates said workpiece, and an imaging mode in which a focused ion beam illuminates said workpiece, said ion beam column being oriented along a column axis, and a workpiece support having a cutting position in which said support holds said front surface at a first angle relative to said column axis, and an imaging position in which said support holds said front surface at a second angle relative to said column axis.

15. The apparatus of claim 14 wherein said first angle is selected such that said column axis and said front surface are substantially perpendicular.

16. The apparatus of claim 14 wherein said second angle is approximately between thirty and sixty degrees.

17. A method for imaging a cross-section of a workpiece, said method comprising the steps of exposing a cross-sectional surface of said workpiece by illuminating, along a first axis and onto said workpiece, a shaped ion beam limited by an aperture using ions generated by a low brightness ion source, and illuminating said cross-sectional surface with a focused particle beam oriented along a second axis intersecting said first axis at a predetermined angle.

18. The method of claim 17 in which exposing a cross-sectional surface of said workpiece by illuminating, along a first axis and onto said workpiece, a shaped ion beam includes illuminating onto said workpiece a shaped ion beam using ions generated by an ion source having a brightness less than 100,000 amps per square centimeter per steradian.

19. The method of claim 18 in which illuminating onto said workpiece a shaped ion beam includes illuminating onto said workpiece a shaped ion beam using ions generated by an ion source having a brightness less than 10,000 amps per square centimeter per steradian.

20. The method of claim 17 in which exposing a cross-sectional surface includes directing a beam of ions generated by a non-liquid metal ion source.

21. A method for imaging a cross-section of a workpiece, said method comprising:

exposing a cross-sectional surface of said workpiece by directing, along a first axis and onto said workpiece, a shaped ion beam;

dithering said shaped ion-beam; and illuminating said cross-sectional surface with a focused particle beam oriented along a second axis intersecting said first axis at a predetermined angle.

22. The method of claim 18 wherein said dithering step comprises the step of deflecting said ion-beam image with a periodic waveform.

* * * * *